United States Patent
Haraguchi

(10) Patent No.: US 10,930,578 B2
(45) Date of Patent: Feb. 23, 2021

(54) CIRCUIT DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Akira Haraguchi, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/495,648

(22) PCT Filed: Mar. 9, 2018

(86) PCT No.: PCT/JP2018/009114
§ 371 (c)(1),
(2) Date: Sep. 19, 2019

(87) PCT Pub. No.: WO2018/180356
PCT Pub. Date: Oct. 4, 2018

(65) Prior Publication Data
US 2020/0020608 A1 Jan. 16, 2020

(30) Foreign Application Priority Data
Mar. 30, 2017 (JP) .............................. JP2017-068331

(51) Int. Cl.
*H05K 7/20* (2006.01)
*H01L 23/40* (2006.01)
(Continued)

(52) U.S. Cl.
CPC .......... *H01L 23/4006* (2013.01); *H01L 25/16* (2013.01); *H05K 5/0047* (2013.01);
(Continued)

(58) Field of Classification Search
CPC ..... H01L 25/18; H01L 23/4006; H01L 25/16; H01L 2023/4018; H01L 2023/4068;
(Continued)

(56) References Cited

U.S. PATENT DOCUMENTS

2003/0137813 A1* 7/2003 Onizuka ................ H05K 7/026
361/777
2003/0168432 A1* 9/2003 Onizuka ................ H05K 7/026
218/7
(Continued)

FOREIGN PATENT DOCUMENTS

JP H3-069185 A 3/1991
JP H4-093159 A 8/1992
(Continued)

OTHER PUBLICATIONS

International Search Report, Application No. PCT/JP2018/009114, dated May 22, 2018. ISA/Japan Patent Office.

*Primary Examiner* — Adam B Dravininkas
(74) *Attorney, Agent, or Firm* — Honigman LLP

(57) ABSTRACT

A plate-shaped conductor is placed on an upper surface of a plate-shaped heat dissipation member with an insulation member interposed therebetween. A heat insulation member is placed at a location that is different from a location where the conductor is placed, on the upper surface of the heat dissipation member. An FET is electrically connected to the conductor. When current flows through the FET, the FET generates heat. A microcomputer that outputs a control signal for controlling operation of the FET is connected to an upper surface of the circuit board and is located opposite to the heat insulation member with the circuit board interposed therebetween.

7 Claims, 8 Drawing Sheets

(51) Int. Cl.
*H01L 25/16* (2006.01)
*H05K 5/00* (2006.01)

(52) U.S. Cl.
CPC .. *H05K 7/20509* (2013.01); *H01L 2023/4018* (2013.01); *H01L 2023/4068* (2013.01)

(58) Field of Classification Search
CPC ....... H01L 23/40; H01L 25/07; H05K 7/1432; H05K 7/209; H05K 7/2089; H05K 1/0203; H05K 7/20854; H05K 7/20436; H05K 5/0047; H05K 7/20845; H05K 7/1427; H05K 7/20509
See application file for complete search history.

(56) References Cited

U.S. PATENT DOCUMENTS

| | | | |
|---|---|---|---|
| 2003/0200761 A1* | 10/2003 | Funahashi | F04B 35/04 62/228.4 |
| 2004/0160731 A1* | 8/2004 | Yamaguchi | H05K 3/284 361/600 |
| 2004/0160754 A1* | 8/2004 | Kobayashi | H05K 7/20854 361/783 |
| 2005/0128706 A1* | 6/2005 | Maly | H01L 23/427 361/699 |
| 2006/0064998 A1* | 3/2006 | Funahashi | F01C 21/10 62/228.4 |
| 2007/0205038 A1* | 9/2007 | Tominaga | H05K 1/18 180/444 |
| 2008/0112201 A1* | 5/2008 | Yahata | H02M 7/003 363/131 |
| 2012/0098361 A1* | 4/2012 | Yamasaki | H02K 11/33 310/52 |
| 2013/0088128 A1* | 4/2013 | Nakano | H05K 7/2039 310/68 R |
| 2014/0116798 A1* | 5/2014 | Nagase | H05K 1/0298 180/443 |
| 2015/0360961 A1* | 12/2015 | Oikawa | B01J 13/0091 423/338 |
| 2018/0027645 A1* | 1/2018 | Tahara | H05K 1/02 361/707 |

FOREIGN PATENT DOCUMENTS

| | | |
|---|---|---|
| JP | 2003-164040 A | 6/2003 |
| WO | 2014-064822 A1 | 5/2014 |

\* cited by examiner

CIRCUIT DEVICE

CROSS-REFERENCE TO RELATED APPLICATIONS

This application is the U.S. national stage of PCT/JP2018/009114 filed on Mar. 9, 2018, which claims priority of Japanese Patent Application No. JP 2017-068331 filed on Mar. 30, 2017, the contents of which are incorporated herein.

TECHNICAL FIELD

The present disclosure relates to a circuit device.

BACKGROUND

JP 2003-164040A discloses an electrical junction box that is connected to a battery and a load, such as a head lamp or a wiper. In this electrical junction box, a plurality of plate-shaped conductors are placed on a placement surface of a heat dissipation member with an insulation member interposed therebetween, and plate surfaces on one side of the conductors face the placement surface. One end and another end of a semiconductor switch are respectively connected to two of the plurality of conductors. The one end of the semiconductor switch is connected to the battery via one of the two conductors, and the other end of the semiconductor switch is connected to the load via the other of the two conductors.

A circuit board is arranged on plate surfaces on the other side of the plurality of conductors, and a plate surface of the circuit board faces the plate surfaces on the other side of the conductors. A control element is arranged on the other plate surface of the circuit board, and the control element outputs control signals for turning the semiconductor switch ON or OFF. If the control element outputs a control signal for turning the semiconductor switch ON, the semiconductor switch is switched ON and power is supplied from the battery to the load with current flowing via the semiconductor switch. If the control element outputs a control signal for turning the semiconductor switch OFF, the semiconductor switch is switched OFF and power supply from the battery to the load is stopped with the flow of current via the semiconductor switch being interrupted.

When current is flowing via the semiconductor switch, the semiconductor switch generates heat. The heat generated by the semiconductor switch is conducted by the conductors and the heat dissipation member in this order, and dissipates from the heat dissipation member.

In the electrical junction box described in JP 2003-164040A, the heat dissipation member, the conductors, the circuit board, and the control element are arranged in this order. Therefore, heat generated by the semiconductor switch is conducted via the conductors and the circuit board to the control element. Accordingly, if the temperature of the semiconductor switch increases, the temperature of the control element increases at a speed that is substantially the same as the speed at which the temperature of the semiconductor switch increases.

The control element has low heat resistance, and therefore the upper limit value of the temperature of the semiconductor switch up to which its normal operation is ensured is usually higher than the upper limit value of the temperature of the control element up to which its normal operation is ensured. In this case, operation of the semiconductor switch is controlled such that the temperature of the semiconductor switch does not become higher than or equal to the upper limit value of the temperature of the control element. For example, if the temperature of the semiconductor switch becomes close to the upper limit value of the temperature of the control element, the control element outputs a control signal to switch the semiconductor switch OFF and stop power supply via the semiconductor switch.

As described above, the electrical junction box described in JP 2003-164040A has a problem in that the upper limit value of an allowable temperature of the semiconductor switch is lower than the actual upper limit value of the temperature of the semiconductor switch.

Circuit devices in which such a problem occurs are not limited to the electrical junction box described in JP 2003-164040A. Similar problems occur in circuit devices in which a heat dissipation member, a conductor, a circuit board, and a control element are arranged in this order and a circuit component that generates heat is connected to the conductor.

In such a circuit device, the control element outputs control signals for controlling operation of the circuit component, and the upper limit value of the temperature of the circuit component up to which its normal operation is ensured is higher than the upper limit value of the temperature of the control element up to which its normal operation is ensured. Therefore, the upper limit value of an allowable temperature of the circuit component is lower than the actual upper limit value of the temperature of the circuit component.

SUMMARY

The present disclosure aims to provide a circuit device in which the upper limit value of an allowable temperature of a circuit component is high.

A circuit device according to one aspect of the present disclosure includes a heat dissipation member, a conductor that is placed on a placement surface of the heat dissipation member with an insulation member interposed therebetween, a heat insulation member that is placed at a location on the placement surface that is different from a location where the conductor is placed, a circuit component that is electrically connected to the conductor and generates heat, a circuit board, and a control element that is placed on the circuit board, is located opposite to the heat insulation member with the circuit board interposed therebetween, and outputs a control signal for controlling operation of the circuit component.

Advantageous Effects of Disclosure

According to the present disclosure, the upper limit value of an allowable temperature of a circuit component is high.

DETAILED DESCRIPTION OF PREFERRED EMBODIMENTS

Figure 1:
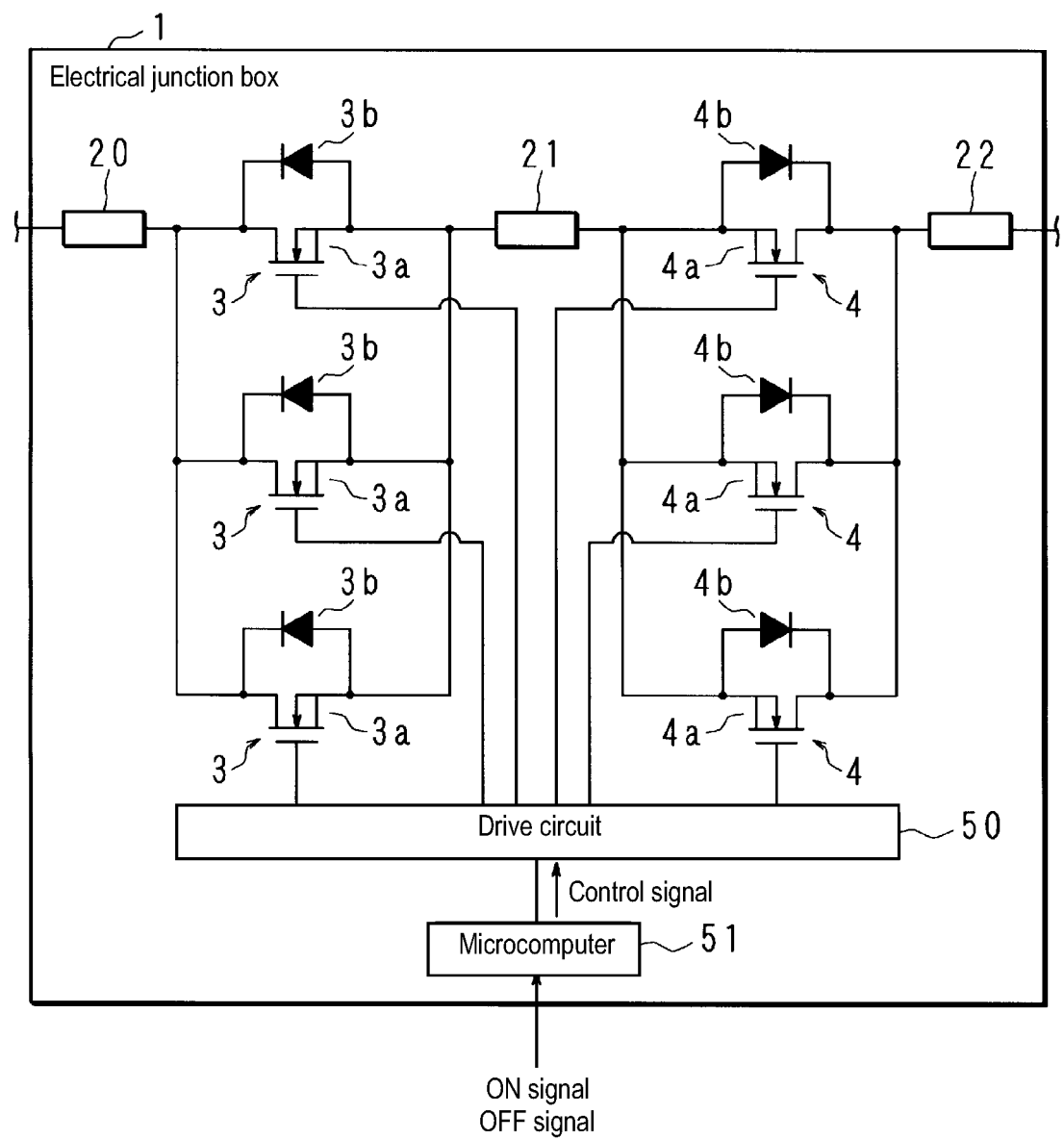
FIG. 1 is a circuit diagram of an electrical junction box in this embodiment.

First, aspects of implementation of the present disclosure will be listed and described. At least some of embodiments described below may also be combined as desired.

A circuit device according to one aspect of the present disclosure includes a heat dissipation member, a conductor that is placed on a placement surface of the heat dissipation member with an insulation member interposed therebetween, a heat insulation member that is placed at a location on the placement surface that is different from a location where the conductor is placed, a circuit component that is electrically connected to the conductor and generates heat, a circuit board, and a control element that is placed on the circuit board, is located opposite to the heat insulation member with the circuit board interposed therebetween, and outputs a control signal for controlling operation of the circuit component.

According to the above-described aspect, the control element is located opposite to the heat insulation member with the circuit board interposed therebetween, and therefore heat generated by the circuit component is hardly conducted to the control element via the conductor or the heat dissipation member. Accordingly, even if the temperature of the circuit component increases, the temperature of the control element hardly increases. As a result, the upper limit value of an allowable temperature of the circuit component is high, because this value is not limited by the upper limit value of the temperature of the control element up to which its normal operation is ensured.

In a circuit device according to another aspect of the present disclosure, the heat insulation member is constituted by non-woven fabric that contains silica aerogel particles.

According to this aspect, the heat insulation member is constituted by non-woven fabric that contains silica aerogel particles, and therefore heat is more unlikely to be conducted from the conductor or the heat dissipation member via the heat insulation member to the control element.

A circuit device according to another aspect of the present disclosure further includes a frame member that is arranged along a circumferential edge of the placement surface of the heat dissipation member and surrounds the circuit component, the circuit board, and the control element, and a lid member that is located opposite to the placement surface of the heat dissipation member and covers the inside of the frame member, wherein the conductor, the circuit component, the circuit board, and the control element are arranged between the placement surface and the lid member.

According to this aspect, the circuit component is covered by the heat dissipation member, the frame member, and the lid member, and therefore air that is in contact with the circuit component is unlikely to be discharged to the outside of the circuit device. Therefore, most of heat generated by the circuit component is conducted by the conductor and the heat dissipation member. The heat insulation member functions more effectively in a configuration in which the frame member and the lid member are provided.

In a circuit device according to another aspect of the present disclosure, the circuit device includes a plurality of the conductors, the circuit component is a semiconductor switch that is electrically connected to two of the plurality of conductors, and the control signal is a signal for turning the circuit component ON or OFF.

According to this aspect, current flows via the two conductors and the semiconductor switch that functions as the circuit component. If the semiconductor switch is switched ON, current is allowed to flow via the two conductors, and if the semiconductor switch is switched OFF, current does not flow via the two conductors.

The following describes specific examples of an electrical junction box (circuit device) according to an embodiment of the present disclosure with reference to the accompanying drawings. Note that the present disclosure is not limited to these examples, but is defined by the claims, and is intended to encompass all modifications within the meanings and scope that are equivalent to the claims.

FIG. 1 is a circuit diagram of an electrical junction box 1 in this embodiment. The electrical junction box 1 is favorably mounted in a vehicle and includes conductors 20, 21, and 22, six N-channel field effect transistors (FETs) 3 and 4, a drive circuit 50, and a microcomputer 51. Each of the conductors 20, 21, and 22 is a so-called bus bar and is made of a copper alloy, for example. The electrical junction box 1 functions as a circuit device.

Each of the FETs 3 includes an FET main body 3a and a diode 3b, and the diode 3b is connected between the drain and the source of the FET main body 3a. Each of the FETs 4 includes an FET main body 4a and a diode 4b, and the diode 4b is connected between the drain and the source of the FET main body 4a. The diodes 3b and 4b are parasitic diodes.

The three FET main bodies 3a are connected in parallel between the conductors 20 and 21, and the three FET main bodies 4a are connected in parallel between the conductors 21 and 22. The drains of the three FET main bodies 3a are connected to the conductor 20, the sources of the six FET main bodies 3a and 4a are connected to the conductor 21, and the drains of the three FET main bodies 4a are connected to the conductor 22. The gates of the six FET main bodies 3a and 4a are connected to the drive circuit 50. Further, the microcomputer 51 is connected to the drive circuit 50.

Each of the FETs 3 and 4 functions as a semiconductor switch. The drive circuit 50 adjusts the voltages at the gates of the six FETs 3 and 4 relative to a fixed potential. Thus, the drive circuit 50 switches the six FETs 3 and 4 ON or OFF.

If the six FETs 3 and 4 are switched ON, current is allowed to flow via the conductors 20, 21, and 22 and the six FETs 3 and 4. If the six FETs 3 and 4 are switched OFF, current does not flow via the conductors 20, 21, and 22 and the six FETs 3 and 4.

When current flows between the drains and the sources of the FETs 3, the FETs 3 generate heat. Similarly, when current flows between the drains and the sources of the FETs 4, the FETs 4 generate heat. Each of the FETs 3 and 4 also functions as a circuit component.

The anodes of the three diodes 3b are connected to the anodes of the three diodes 4b via the conductor 21. Therefore, when the six FETs 3 and 4 are switched OFF, current does not flow via the six diodes 3b and 4b.

An ON signal that turns the six FETs 3 and 4 ON and an OFF signal that turns the six FETs 3 and 4 OFF are input to the microcomputer 51. The microcomputer 51 outputs a control signal that turns the six FETs 3 and 4 ON or OFF to the drive circuit 50 depending on the signal that is input.

Specifically, if an ON signal is input, the microcomputer 51 outputs a control signal for turning the six FETs 3 and 4 ON to the drive circuit 50, and the drive circuit 50 switches the six FETs 3 and 4 ON. If an OFF signal is input, the microcomputer 51 outputs a control signal for turning the six FETs 3 and 4 OFF to the drive circuit 50, and the drive circuit 50 switches the six FETs 3 and 4 OFF.

The control signals are signals for controlling operation of each of the six FETs 3 and 4.

Figure 2:
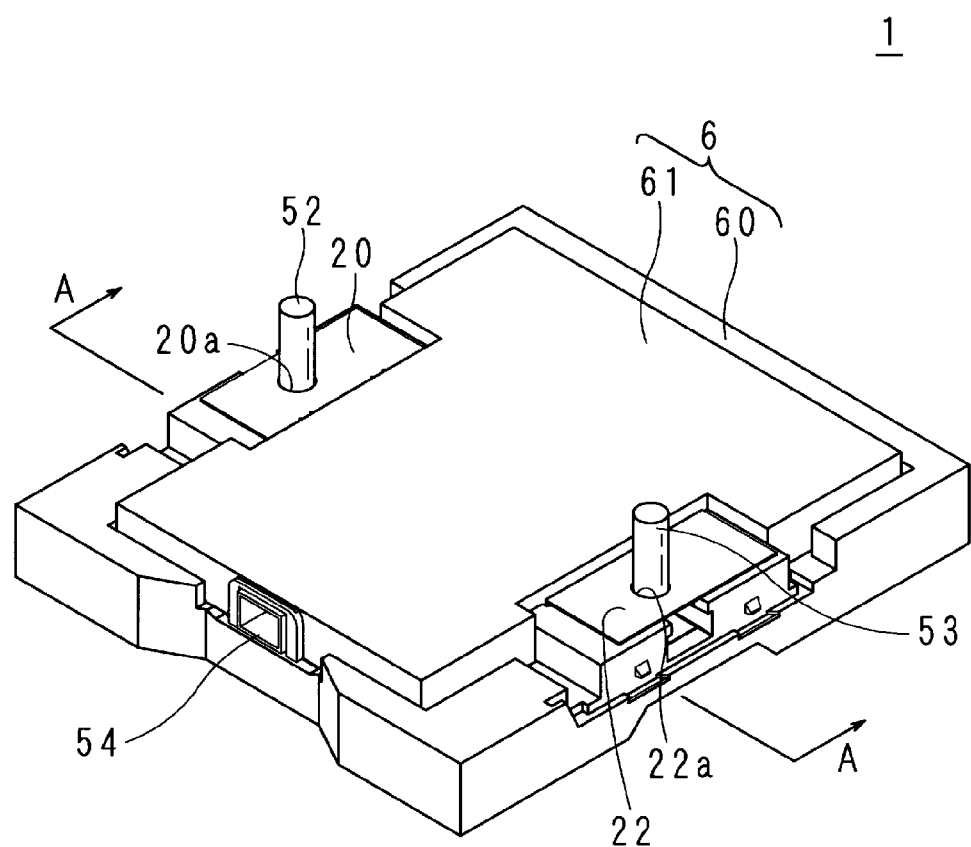
FIG. 2 is a perspective view of the electrical junction box.

FIG. 2 is a perspective view of the electrical junction box 1. The electrical junction box 1 further includes a box-shaped housing member 6, and the six FETs 3 and 4, the drive circuit 50, and the microcomputer 51 are housed in the housing member 6. The housing member 6 includes a rectangular frame member 60 and a lid member 61. The lid member 61 is arranged on the upper side of the electrical junction box 1, is fitted inside the frame member 60, and covers the inside of the frame member 60.

The conductors 20 and 22 are plate-shaped. A plate surface of the conductor 20 covers the upper side of one side portion of the frame member 60, and a plate surface of the conductor 22 covers the upper side of another side portion of the frame member 60. The one side portion of the frame member 60 covered by the conductor 20 and the other side portion of the frame member 60 covered by the conductor 22 are arranged next to each other in the left-right direction and extend in the front-rear direction. Accordingly, the one side portion of the frame member 60 covered by the conductor 20 is located opposite to the other side portion of the frame member 60 covered by the conductor 22. In the following description, the one side portion of the frame member 60 covered by the conductor 20 will be referred to as a left side portion and the other side portion of the frame member 60 covered by the conductor 22 will be referred to as a right side portion.

A cylindrical stud bolt 52 protrudes upward from an upper surface of the left side portion of the frame member 60. The conductor 20 has a through hole 20a that passes therethrough in the up-down direction, and the stud bolt 52 passes through the through hole 20a. Similarly, a cylindrical stud bolt 53 protrudes upward from an upper surface of the right side portion of the frame member 60. The conductor 22 has a through hole 22a that passes therethrough in the up-down direction, and the stud bolt 53 passes through the through hole 22a. The two stud bolts 52 and 53 are located opposite to each other in the left-right direction, and a thread is formed in each of the stud bolts 52 and 53.

Anon-illustrated terminal that has an opening is attached to the stud bolt 52. Specifically, in a state where the stud bolt 52 passes through the opening of the terminal, a non-illustrated nut is tightened to the stud bolt 52. As a result, the conductor 20 and the terminal come into contact with each other and the conductor 20 is electrically connected to the terminal.

Similarly, a non-illustrated terminal that has an opening is attached to the stud bolt 53. Specifically, in a state where the stud bolt 53 passes through the opening of the terminal, a non-illustrated nut is tightened to the stud bolt 53. As a result, the conductor 22 and the terminal come into contact with each other and the conductor 22 is electrically connected to the terminal.

The terminal attached to the stud bolt 52 is connected to a positive electrode of the battery, for example, and the terminal attached to the stud bolt 53 is connected to one end of the load, for example. Power is supplied from the battery to the load via the electrical junction box 1.

The electrical junction box 1 has a connector 54, and a non-illustrated connector that is provided at an end portion of a non-illustrated signal line is fitted into the connector 54.

The ON signal and the OFF signal are input to the microcomputer 51 of the electrical junction box 1 via the signal line.

Figure 3:
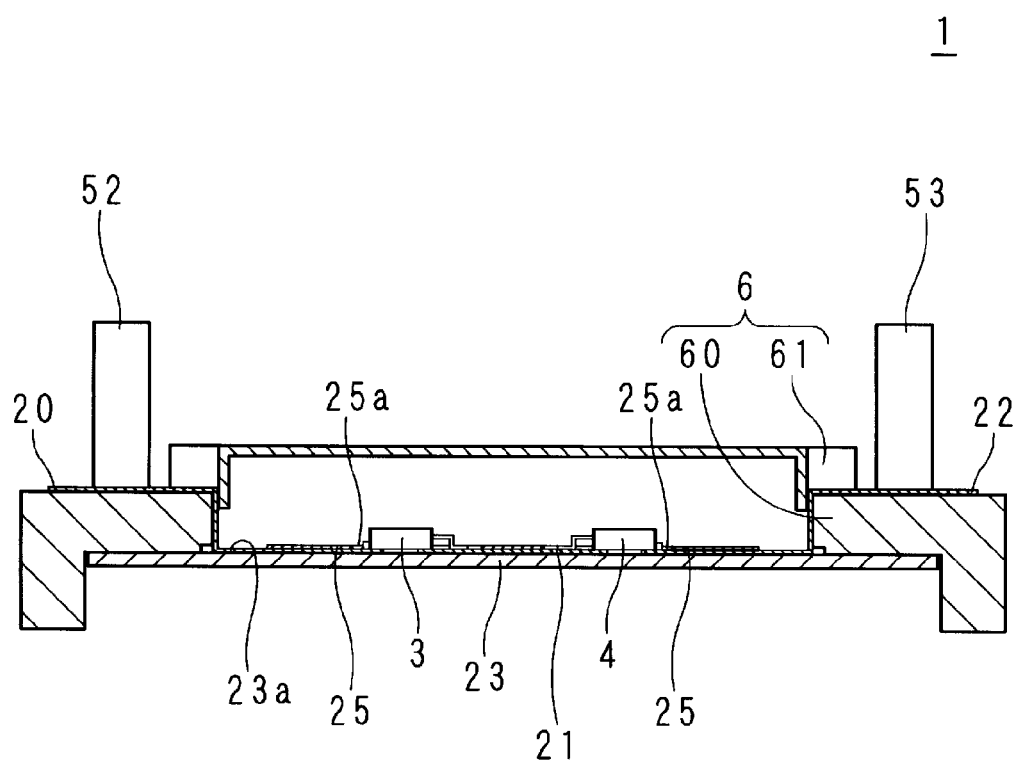
FIG. 3 is a cross-sectional view taken along line A-A in FIG. 2.

FIG. 3 is a cross-sectional view taken along line A-A in FIG. 2. A plate-shaped heat dissipation member 23 is housed in the frame member 60. The heat dissipation member 23 is made of aluminum, for example. The frame member 60 covers a left edge portion and a right edge portion of an upper surface 23a of the heat dissipation member 23. The conductor 20 is bent a plurality of times, and the plate surface of the conductor 20 covers not only the upper surface of the left side portion of the frame member 60 but also a left side portion of the upper surface 23a of the heat dissipation member 23 inside the frame member 60 and an inner surface of the left side portion of the frame member 60. Similarly, the conductor 22 is bent a plurality of times, and the plate surface of the conductor 22 covers not only the upper surface of the right side portion of the frame member 60 but also a right side portion of the upper surface 23a of the heat dissipation member 23 inside the frame member 60 and an inner surface of the right side portion of the frame member 60.

The conductor 21 is also plate-shaped. The conductor 21 is placed between the conductors 20 and 22, on the upper surface 23a of the heat dissipation member 23. The upper surface 23a of the heat dissipation member 23 faces lower surfaces of the conductors 20, 21, and 22, and the upper surface 23a of the heat dissipation member 23 is bonded to the lower surfaces of the conductors 20, 21, and 22 using an insulation member 24 (see FIG. 7) that serves as an adhesive.

As described above, the conductors 20, 21, and 22 are placed on the upper surface 23a of the heat dissipation member 23 with the insulation member 24 interposed therebetween. The upper surface 23a of the heat dissipation member 23 serves as a placement surface.

Inside the frame member 60, the FETs 3 and 4, which are chip-shaped, are arranged on the upper side of the conductors 20, 21, and 22. As described above, the drains of the FETs 3 are electrically connected to the conductor 20, the sources of the FETs 3 and 4 are electrically connected to the conductor 21, and the drains of the FETs 4 are electrically connected to the conductor 22. Inside the frame member 60, a circuit board 25 is arranged on upper surfaces of the conductors 20, 21, and 22. A lower surface of the circuit board 25 faces the upper surfaces of the conductors 20, 21, and 22, and six openings 25a are provided in the circuit board 25 (see FIG. 4). The six FETs 3 and 4 respectively pass through the six openings 25a.

Heat generated by the FETs 3 is conducted by the conductor 20, the insulation member 24, and the heat dissipation member 23 in this order, and is conducted by the conductor 21, the insulation member 24, and the heat dissipation member 23 in this order. Heat generated by the FETs 4 is conducted by the conductor 21, the insulation member 24, and the heat dissipation member 23 in this order, and is conducted by the conductor 22, the insulation member 24, and the heat dissipation member 23 in this order. Heat conducted to the heat dissipation member 23 dissipates from the heat dissipation member 23 to the outside of the electrical junction box 1.

Figure 4:
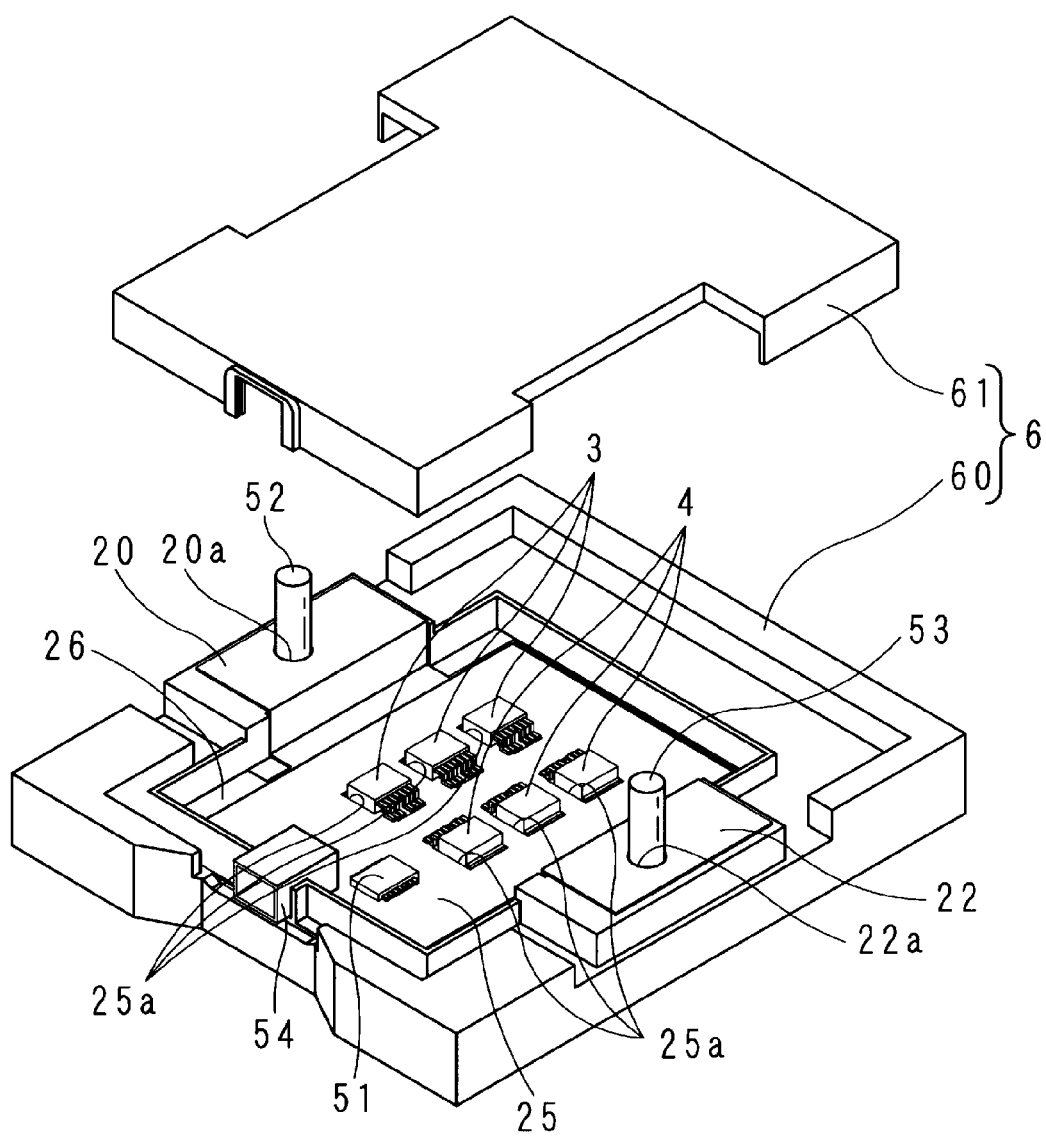
FIG. 4 is a perspective view of the electrical junction box from which a lid member is removed.
Figure 5:
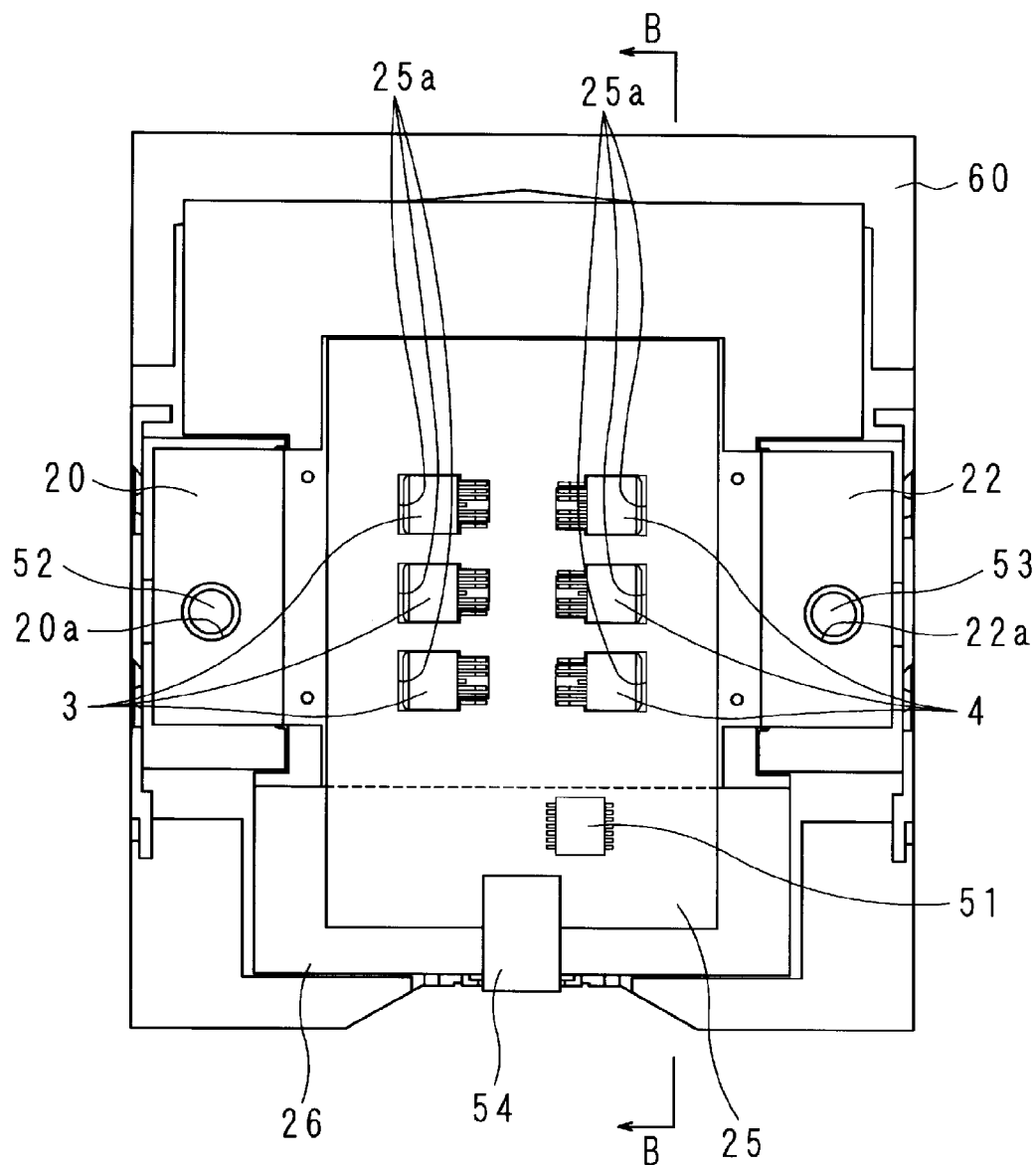
FIG. 5 is a plan view of the electrical junction box from which the lid member is removed.

FIG. 4 is a perspective view of the electrical junction box 1 from which the lid member 61 is removed, and FIG. 5 is a plan view of the electrical junction box 1 from which the lid member 61 is removed. The circuit board 25 has a rectangular shape and extends in the front-rear direction. The six openings 25a are provided in a lattice pattern in the circuit board 25. Three openings 25a are arranged in the front-rear direction and two openings 25a are arranged in the left-right direction.

The three FETs 3 are respectively arranged in three openings 25a that are provided in a left side portion of the circuit board 25. The three FETs 4 are respectively arranged in three openings 25a that are provided in a right side portion of the circuit board 25. The gates of the FETs 3 and 4 are electrically connected to a conductive pattern 25b (shown on FIG. 7) that is provided on an upper surface of the circuit board 25.

The microcomputer 51 is chip-shaped and is arranged in a front side portion of the upper surface of the circuit board 25. Also, the connector 54 is provided in the front side portion of the upper surface of the circuit board 25. The drive circuit 50 is formed on the upper surface of the circuit board 25. It should be noted that the drive circuit 50 is not illustrated in FIGS. 4 and 5.

The microcomputer 51 is electrically connected individually to the drive circuit 50 and the connector 54 by the conductive pattern 25b provided on the upper surface of the circuit board 25. The drive circuit 50 is electrically connected to the gates of the six FETs 3 and 4 by the conductive pattern 2 provided on the upper surface of the circuit board 25.

As described above, the connector of the signal line is fitted into the connector 54. The ON signal and the OFF signal are input via the signal line and the conductive pattern 25b to the microcomputer 51. Also, control signals are input from the microcomputer 51 via the conductive pattern 25b to the drive circuit 50. Further, the drive circuit 50 applies a voltage to the gates of the six FETs 3 and 4 via the conductive pattern 25b and adjusts the voltages at these gates relative to a fixed potential.

As described above, if an ON signal is input, the microcomputer 51 outputs a control signal for turning the six FETs 3 and 4 ON to the drive circuit 50, and the drive circuit 50 switches the six FETs 3 and 4 ON. If an OFF signal is input, the microcomputer 51 outputs a control signal for turning the six FETs 3 and 4 OFF to the drive circuit 50, and the drive circuit 50 switches the six FETs 3 and 4 OFF.

As shown in FIGS. 3 and 4, the lid member 61 is located opposite to the upper surface 23a of the heat dissipation member 23 and covers the six FETs 3 and 4, the circuit board 25, and the microcomputer 51. The six FETs 3 and 4, the three conductors 20, 21, and 22, the circuit board 25, and the microcomputer 51 are arranged between the upper surface 23a of the heat dissipation member 23 and the lid member 61.

Figure 6:
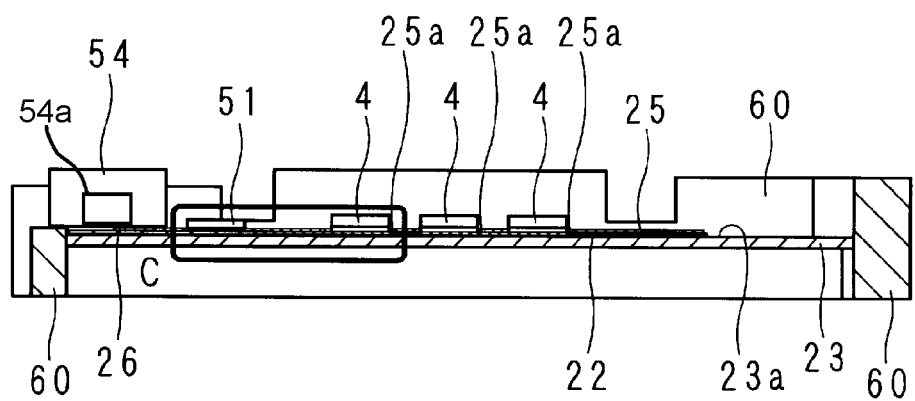
FIG. 6 is a cross-sectional view taken along line B-B in FIG. 5.

FIG. 6 is a cross-sectional view taken along line B-B in FIG. 5. As shown in FIGS. 4, 5, and 6, a rectangular sheet-shaped heat insulation member 26 is arranged on the front side portion of the upper surface 23a of the heat dissipation member 23 inside the frame member 60. The heat insulation member 26 is placed at a location that is different from locations where the three conductors 20, 21, and 22 are placed, on the upper surface 23a of the heat dissipation member 23. The heat insulation member 26 is constituted by non-woven fabric that contains silica aerogel particles. The circuit board 25 extends forward past the three conductors 20, 21, and 22, and an extension portion of the circuit board 25 is arranged on the upper side of the heat insulation member 26. The microcomputer 51 is arranged on an upper surface of the extension portion of the circuit board 25, and the microcomputer 51 is located opposite to the heat insulation member 26 with the circuit board 25 interposed therebetween. The microcomputer 51 functions as a control element.

As shown in FIGS. 3 and 6, the frame member 60 is arranged along the circumferential edge of the upper surface 23a of the heat dissipation member 23 and surrounds the six FETs 3 and 4, the circuit board 25, and the microcomputer 51.

Figure 7:
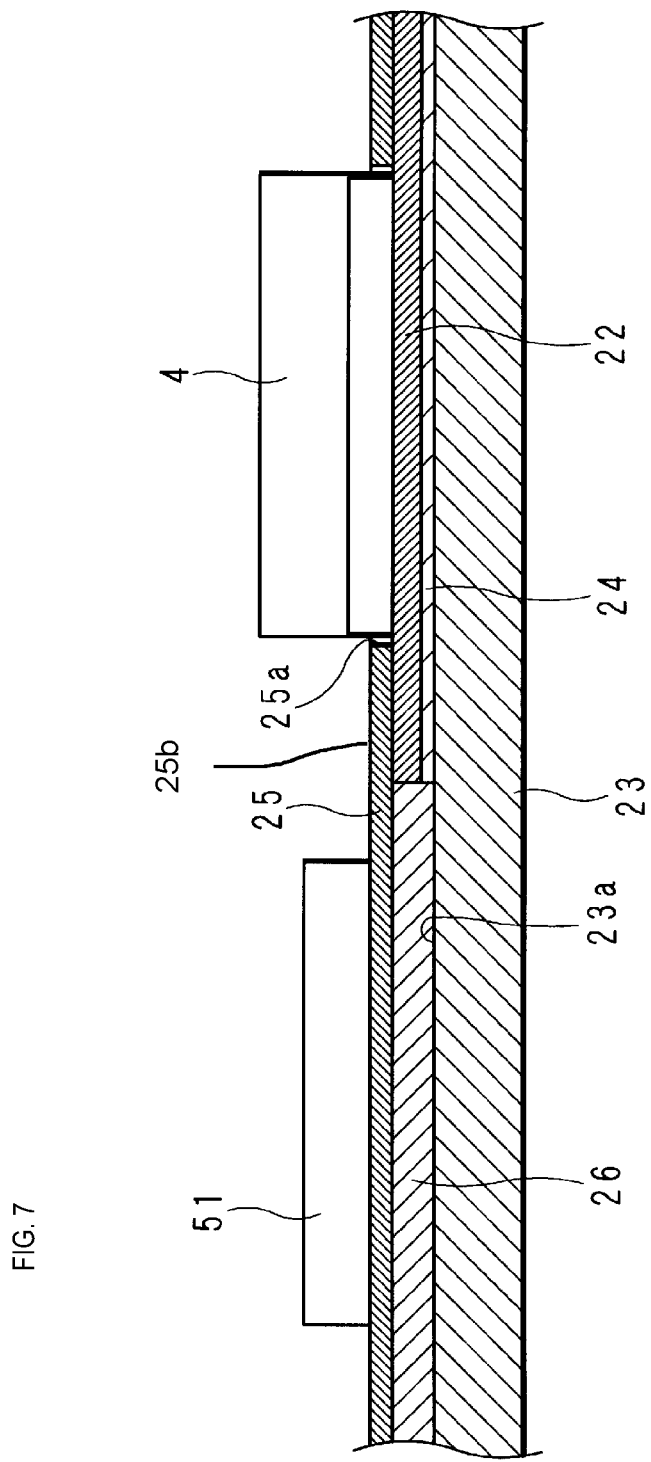
FIG. 7 is an enlarged view of a portion indicated by C in FIG. 6.

FIG. 7 is an enlarged view of a portion indicated by C in FIG. 6. As described above, the lower surfaces of the conductors 20, 21, and 22 are bonded to the upper surface 23a of the heat dissipation member 23 using the insulation member 24 that serves as an adhesive, and the insulation member 24 has the shape of a layer. Specifically, the insulation member 24 is applied onto the upper surface 23a of the heat dissipation member 23, and the conductors 20, 21, and 22 are arranged on the upper side of the insulation member 24. In this state, the insulation member 24 is heated. As a result, the insulation member 24 is cured and each of the conductors 20, 21, and 22 is bonded to the upper surface 23a of the heat dissipation member 23 via the insulation member 24.

Current does not flow through the insulation member 24, and accordingly current does not flow from the conductors 20, 21, and 22 to the heat dissipation member 23. The insulation member 24 has heat dissipation properties. Therefore, heat is conducted from each of the conductors 20, 21, and 22 via the insulation member 24 to the heat dissipation member 23. The insulation member 24 is made of an epoxy resin that contains a heat-conductive filler, for example. For example, aluminum oxide is used as the heat-conductive filler.

In the electrical junction box 1 configured as described above, the microcomputer 51 is located opposite to the heat insulation member 26 with the circuit board 25 interposed therebetween, and therefore heat generated by the six FETs 3 and 4 is hardly conducted to the microcomputer 51 via one of the conductors 20, 21, and 22 or the heat dissipation member 23. Therefore, even if the temperatures of the six FETs 3 and 4 increase, the temperature of the microcomputer 51 hardly increases.

The microcomputer 51 has low heat resistance, and therefore the upper limit values of the temperatures of the FETs 3 and 4 up to which their normal operation is ensured are higher than the upper limit value of the temperature of the microcomputer 51 up to which its normal operation is ensured. However, even if the temperatures of the six FETs 3 and 4 increase, the temperature of the microcomputer 51 hardly increases, and accordingly the upper limit values of allowable temperatures of the FETs 3 and 4 are high, because these values are not limited by the upper limit value of the temperature of the microcomputer 51 up to which its normal operation is ensured.

The conductors 20, 21, and 22 and the heat dissipation member 23 are made of metal, and therefore they have high heat conductivities. On the other hand, the circuit board 25 is constituted by an insulation plate on which the conductive pattern is formed, and the heat conductivity of the insulation plate is sufficiently lower than the heat conductivities of the conductors 20, 21, and 22 and the heat dissipation member 23. Therefore, heat is hardly conducted from the six FETs 3 and 4 via the circuit board 25 to the microcomputer 51.

There may be a case where the electrical junction box 1 includes, other than the microcomputer 51, a low-temperature element 54a whose upper limit value of the temperature up to which its normal operation is ensured, that is, whose upper limit value of a proper temperature is lower than the upper limit values of proper temperatures of the FETs 3 and 4. Examples of such a low-temperature element 54a include a control integrated circuit (IC), an aluminum electrolytic capacitor, and the like. If a low-temperature element 54a other than the microcomputer 51 is included, for example, if a low-temperature element 54a is included in the drive circuit 50, it is preferable that the low-temperature element other than the microcomputer 51 is also arranged on the upper surface of the circuit board 25 so as to be located opposite to the heat insulation member 26 with the circuit board 25 interposed therebetween.

As described above, the heat insulation member 26 is constituted by non-woven fabric that contains silica aerogel particles, and therefore the heat conductivity of the heat insulation member 26 is lower than the heat conductivity of air. As a result, heat is unlikely to be conducted via at least one of the conductors 20, 21, and 22 and the heat dissipation member 23 to the microcomputer 51.

Furthermore, the six FETs 3 and 4, the circuit board 25, the drive circuit 50, and the microcomputer 51 are covered by the heat dissipation member 23, the frame member 60, and the lid member 61. Therefore, air that is in contact with the six FETs 3 and 4 is unlikely to be discharged to the outside of the electrical junction box 1. Accordingly, most of heat generated by the six FETs 3 and 4 is conducted by one of the conductors 20, 21, and 22, and the heat dissipation member 23. Therefore, the heat insulation member 26 functions more effectively in a configuration in which the frame member 60 and the lid member 61 are provided.

It should be noted that the six FETs 3 and 4, the circuit board 25, the drive circuit 50, and the microcomputer 51 are liquid-tightly sealed by the heat dissipation member 23, the frame member 60, the lid member 61, and the like.

Figure 8:
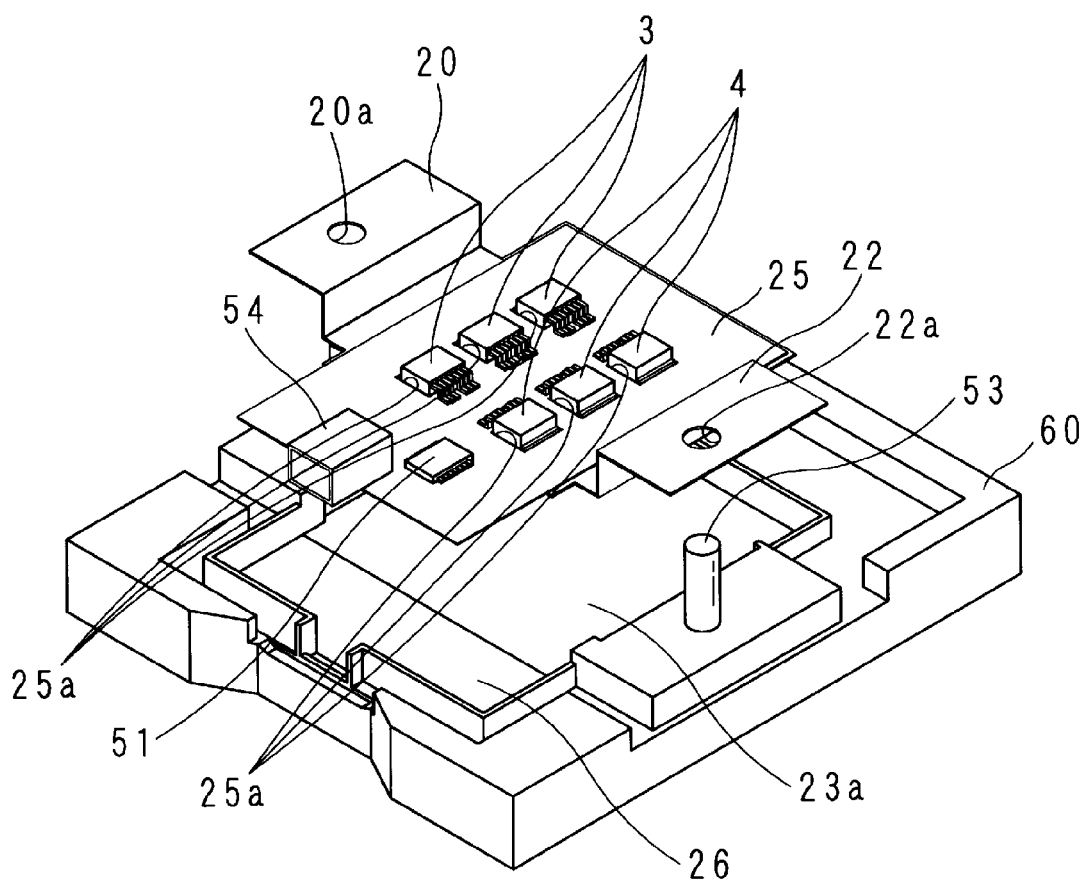
FIG. 8 is a diagram illustrating manufacture of the electrical junction box.

Next, a manufacturing method of the electrical junction box 1 will be described. FIG. 8 is a diagram illustrating manufacture of the electrical junction box 1. First, the conductors 20, 21, and 22 are manufactured by cutting and bending metal plates made of a copper alloy. Next, the circuit board 25 is affixed to the conductors 20, 21, and 22, and the six FETs 3 and 4 are respectively attached to the six openings 25a provided in the circuit board 25. Thereafter, a plurality of elements including the microcomputer 51 are attached to the upper surface of the circuit board 25. Next, the insulation member 24 that serves as an adhesive is applied onto the upper surface 23a of the heat dissipation member 23, and the heat dissipation member 23 is attached to the inside of the frame member 60 that is provided with the two stud bolts 52 and 53.

Next, the insulation member 26 is arranged on the front side portion of the upper surface 23a of the heat dissipation member 23, and the three conductors 20, 21, and 22 and the circuit board 25 are arranged on the upper side of the heat dissipation member 23 such that the microcomputer 51 is located opposite to the heat insulation member 26 with the circuit board 25 interposed therebetween. Thereafter, the insulation member 24 is cured through heating. As a result, the lower surfaces of the conductors 20, 21, and 22 are bonded to the upper surface 23a of the heat dissipation member 23. Thereafter, the lid member 61 is fitted inside the frame member 60 from above.

It should be noted that a configuration is also possible in which the sources of the three FETs 3 are connected to the conductor 20, the drains of the six FETs 3 and 4 are connected to the conductor 21, and the sources of the three FETs 4 are connected to the conductor 22. In this case as well, current does not flow via the six diodes 3b and 4b so long as the six FETs 3 and 4 are switched OFF.

The number of FETs 3 and the number of FETs 4 are not limited to three, and may be one, two, or four or more. A configuration is also possible in which the number of FETs 3 is not the same as the number of FETs 4. Further, the FETs 3 and the FETs 4 are not limited to the N-channel type. The FETs 3 and the FETs 4 may also be of the P-channel type. However, the type of the FETs 3 is the same as the type of the FETs 4.

The FETs 3 and 4 are only required to function as semiconductor switches, and therefore bipolar transistors, insulated gate bipolar transistors (IGBTs), or the like may be used instead of the FETs 3 and 4. If parasitic diodes are not formed in semiconductor switches, current does not flow via the semiconductor switches when the semiconductor switches are switched OFF. Therefore, if parasitic diodes are not formed in the semiconductor switches, a configuration is also possible that does not include semiconductor switches that are electrically connected between the conductors 21 and 22. In this case, the conductors 21 and 22 are formed as one piece and are treated as one conductor. Further, if there is no possibility that current flows through the conductors 22, 21, and 20 in this order, it is not necessary to provide the FETs 4 in the electrical junction box 1. In this case as well, the conductors 21 and 22 are formed as one piece and are treated as one conductor. If the conductors 21 and 22 are treated as one conductor, the number of conductors is two.

The heat insulation member 26 is only required to be a member that has a sufficiently low heat conductivity, and is not required to be necessarily constituted by non-woven fabric that contains silica aerogel particles. Also, the circuit components connected to the conductors 20, 21, and 22 are not limited to semiconductor switches, and are only required to be components that generate heat. Further, the microcomputer 51 is only required to function as the control element that outputs control signals. Therefore, an element that outputs control signals may be used instead of the microcomputer 51. The number of conductors is not limited to two or three, and may be one, or four or more.

The disclosed embodiment is an illustrative example in all aspects and should not be considered as restrictive. The scope of the present disclosure is defined not by the above descriptions but by the claims, and is intended to encompass all modifications within the meanings and scope that are equivalent to the claims.

The invention claimed is:

1. A circuit device comprising:
   a heat dissipation member;
   a plurality of conductors that are placed on a placement surface of the heat dissipation member with an insulation member interposed therebetween;
   a heat insulation member that is placed at a location on the placement surface that is different from locations where the plurality of conductors are placed;
   a semiconductor switch that is electrically connected to two of the plurality of conductors and generates heat;
   a circuit board having an opening, the semiconductor switch disposed in the opening;
   a control element that is placed on the circuit board and spaced apart from the opening the control element is located opposite to the heat insulation member with the circuit board interposed therebetween, and outputs a control signal for controlling operation of the semiconductor switch, wherein the heat insulation member is also spaced apart from the opening and the semiconductor switch; and a drive circuit that switches the semiconductor switch ON or OFF based on a control signal that is output by the control element,
wherein the control signal is a signal for turning the semiconductor switch ON or OFF,
an element that is included in the drive circuit is placed on the circuit board and is located opposite to the heat insulation member with the circuit board interposed therebetween the element being an electric component having an upper limit temperature value that is lower than an upper limit temperature value of the semiconductor switch,
the circuit board has a conductive pattern that electrically connects the drive circuit and the semiconductor switch to each other, and
each of the conductors is a bus bar that is thicker than the conductive pattern and the insulation member.

2. The circuit device according to claim 1, wherein the heat insulation member is constituted by non-woven fabric that contains silica aerogel particles.

3. The circuit device according to claim 1, further comprising:
a frame member that is arranged along a circumferential edge of the placement surface of the heat dissipation member and surrounds the semiconductor switch, the circuit board, and the control element; and
a lid member that is located opposite to the placement surface of the heat dissipation member and covers the inside of the frame member,
wherein the conductors, the semiconductor switch, the circuit board, and the control element are arranged between the placement surface and the lid member.

4. The circuit device according to claim 1,
wherein the insulation member is an adhesive that bonds the conductors to the heat dissipation member,
the heat insulation member is placed on the heat dissipation member so as to be flush with the conductors that are placed on the heat dissipation member with the insulation member interposed therebetween, and
a portion of the conductive pattern is located opposite to the heat insulation member with the circuit board interposed therebetween, and another portion of the conductive pattern is located opposite to the conductors with the circuit board interposed therebetween.

5. The circuit device according to claim 2, further comprising:
a frame member that is arranged along a circumferential edge of the placement surface of the heat dissipation member and surrounds the semiconductor switch, the circuit board, and the control element; and
a lid member that is located opposite to the placement surface of the heat dissipation member and covers the inside of the frame member,
wherein the conductors, the semiconductor switch, the circuit board, and the control element are arranged between the placement surface and the lid member.

6. The circuit device according to claim 2,
wherein the insulation member is an adhesive that bonds the conductors to the heat dissipation member,
the heat insulation member is placed on the heat dissipation member so as to be flush with the conductors that are placed on the heat dissipation member with the insulation member interposed therebetween, and
a portion of the conductive pattern is located opposite to the heat insulation member with the circuit board interposed therebetween, and another portion of the conductive pattern is located opposite to the conductors with the circuit board interposed therebetween.

7. The circuit device according to claim 3,
wherein the insulation member is an adhesive that bonds the conductors to the heat dissipation member,
the heat insulation member is placed on the heat dissipation member so as to be flush with the conductors that are placed on the heat dissipation member with the insulation member interposed therebetween, and
a portion of the conductive pattern is located opposite to the heat insulation member with the circuit board interposed therebetween, and another portion of the conductive pattern is located opposite to the conductors with the circuit board interposed therebetween.

* * * * *